United States Patent [19]
Takano et al.

[11] Patent Number: 5,867,234
[45] Date of Patent: Feb. 2, 1999

[54] MANUFACTURING METHOD OF MIM NONLINEAR DEVICE, MIM NONLINEAR DEVICE, AND LIQUID CRYSTAL DISPLAY DEVICE

[75] Inventors: Yasushi Takano; Takumi Seki; Yasuhiro Yoshimizu; Takashi Inoue, all of Suwa, Japan

[73] Assignee: Seiko Epson Corporation, Tokyo, Japan

[21] Appl. No.: 750,042

[22] PCT Filed: Apr. 1, 1996

[86] PCT No.: PCT/JP96/00903

§ 371 Date: Nov. 29, 1996

§ 102(e) Date: Nov. 29, 1996

[87] PCT Pub. No.: WO96/30953

PCT Pub. Date: Oct. 3, 1996

[30] Foreign Application Priority Data

Mar. 31, 1995 [JP] Japan ..................................... 7-100371

[51] Int. Cl.[6] .............................. C23C 28/00; C25D 5/50; B05D 3/02; G02F 1/135
[52] U.S. Cl. .......................... 349/52; 205/188; 205/189; 205/224; 205/229; 427/377; 427/404; 427/419.2; 349/49
[58] Field of Search ..................................... 205/188, 189, 205/224, 229; 427/377, 404, 419.2; 349/49; 340/52

[56] References Cited

FOREIGN PATENT DOCUMENTS

| | | |
|---|---|---|
| 0 610 082 A | 8/1994 | European Pat. Off. . |
| 56-150188 | 11/1981 | Japan . |
| 62-150787 | 7/1987 | Japan . |
| 63-50081 | 3/1988 | Japan . |
| 64-63929 | 3/1989 | Japan . |
| 2-301727 | 12/1990 | Japan . |
| 6-750250 | 3/1994 | Japan . |
| 6-75250 | 3/1994 | Japan . |

*Primary Examiner*—Kathryn Gorgos
*Assistant Examiner*—Edna Wong
*Attorney, Agent, or Firm*—Oliff & Berridge, PLC

[57] ABSTRACT

In a manufacturing method of a MIM nonlinear device (50) having a Ta electrode layer (16), an anodic oxidation film (18) and a Cr electrode layer (20), tantalum oxidation film (14) is first formed on the transparent substrate (12). The Ta electrode layer (16) is formed on the tantalum oxidation film (14) and the anodic oxidation film (18) is formed on the Ta electrode layer (16). Then, heat treatment is performed to the substrate. The final temperature drop in the heat treatment process is carried out in the atmosphere that contains water vapor. After that, the Cr electrode layer (20) is formed to complete the MIM nonlinear device (50). By conducting the heat treatment in the atmosphere that contains water vapor, the nonlinear characteristics of the MIM device can be improved as well as the improvement of the resistance characteristic in the OFF state.

24 Claims, 10 Drawing Sheets

MANUFACTURING METHOD OF MIM NONLINEAR DEVICE, MIM NONLINEAR DEVICE, AND LIQUID CRYSTAL DISPLAY DEVICE

This is a national stage application of PCT/JP96/00903 filed Apr. 1, 1996.

BACKGROUND OF THE INVENTION

1. Field of the Invention

This invention relates to a manufacturing method of a MIM (Metal-Insulator-Metal) nonlinear device, and to an MIM nonlinear device and a liquid crystal display device.

2. Related Art

Generally, active matrix liquid crystal display devices comprise two substrates, between which liquid crystal is filled. On one substrate, a switching device is provided for each pixel region to form a matrix array, and on the other substrate, a color filter is formed. The orientation of the liquid crystal is controlled in each pixel region, thereby displaying prescribed information. As the switching device, a three-terminal device, such as a TFT (Thin Film Transistor), or a two-terminal device, such as MIM nonlinear device, are typically used. A MIM nonlinear device is advantageous in responding to the demand for a large-sized screen and reduced manufacturing cost. Moreover, a MIM nonlinear device has another advantage of eliminating crossover short-circuit between the scan line and the data line because scan lines and data lines are separately provided on different substrates. That is, scan lines are provided on the substrate having a matrix array formed thereon while data lines are provided on the other substrate.

FIG. 14 shows an example of the conventional active matrix liquid crystal display device 100 using an MIM nonlinear device, in which a matrix is formed by a plurality of scan lines 74 connected to the scan line driving circuit 72, and a plurality of data lines 78 connected to the data line driving circuit 76. Pixel region 80 is formed in each element of the matrix. Pixel region 80 includes a MIM nonlinear device 50 connected to the data line 78 at one end, and a liquid crystal display element 60 connected between the MIM nonlinear device 50 and the scan line 74. Liquid crystal display element 60 is driven based on the differential voltage between the signal applied to the scan line 74 and the signal applied to the data line 78. If the threshold voltage of liquid crystal element 60 is represented as (Vb), and the threshold voltage of MIM nonlinear device 50 is represented as (Vth), and if the voltage at both terminals of the liquid crystal display element 60, which turns on the liquid crystal display element 60, is represented as (Vb+ΔV), then the liquid crystal display element 60 is in the ON state when the differential voltage is (Vb+Vth+ΔV) during a selected period, while the liquid crystal display element 60 is in the OFF state when the differential voltage is (Vb+Vth). During a non-selected period, the differential voltage is set to less than (Vth) to maintain the state decided during the selected period.

FIG. 15 is a cross-sectional view of the active matrix liquid crystal display device 100 using an MIM nonlinear device. Liquid crystal layer 40 is positioned between the electrode substrates 10 and 30. Electrode substrate 10 comprises a transparent board 12, MIM nonlinear devices 50 formed on the transparent board 12, and pixel electrodes 22 connected to the corresponding MIM nonlinear device 50. MIM nonlinear device 50 is composed of a Ta electrode layer 16 formed on the transparent electrode 12, a $Ta_2O_5$ film 18 formed on the Ta electrode 16, and a Cr electrode layer 20 formed on the $Ta_2O_5$ film 18. $Ta_2O_5$ film 18 is formed on the surface of the Ta electrode layer 16 through anodic oxidation of the Ta electrode layer 16 so that the film thickness becomes uniform without generating pin holes. (See Japanese Patent Application Laid-Opens 5-297389 and 5-313207.)

With the conventional method, MIM nonlinear device 50 having such a structure is manufactured as follows: forming a tantalum oxide layer 14 with a thickness of about 1000 Å by depositing a tantalum layer on the transparent substrate 12 by sputtering, followed by heat oxidation; depositing a tantalum layer up to about 3000 Å by sputtering, and patterning the tantalum layer to form a Ta electrode layer 16; performing anodic oxidation to the Ta electrode layer 16 to form a $Ta_2O_5$ anodic oxidation film 18; and depositing chromium film with a thickness 1500 Å by sputtering and patterning the chromium film to form a Cr electrode layer 20, thereby completing a MIM nonlinear device 50.

IEEE Trans Electron Device, Vol. ED28, pp. 736–739, June 1981, proposes a technique for doping nitrogen into Ta electrode layer 16 composing an MIM nonlinear device, in order to improve the nonlinear characteristics of the MIM nonlinear device. However, this technique requires highly advanced technology of tantalum sputtering, and makes it difficult to manufacture the MIM nonlinear device with good repeatability.

Japanese Patent Application Laid-Open 63-50081 proposes a technique of anodic oxidation of the tantalum film, which is followed by heat treatment at a temperature from 400° C. to 600° C. in the nitrogen atmosphere, for improving the nonlinear characteristic of the MIM nonlinear device. However, simply conducting heat treatment at 400°–600° C. in the nitrogen atmosphere after the anodic oxidation of the tantalum film can not achieve an adequate nonlinear characteristic and a satisfactory resistance characteristic in the OFF state, which are required for obtaining an excellent image quality. Thus, further improvement of the nonlinear characteristic and resistance characteristic has been desired.

Therefore, the objective of the invention is to provide a method for manufacturing an MIM nonlinear device, which is capable of improving the nonlinear characteristic and resistance characteristic in the OFF state of a MIM nonlinear device, and to provide a liquid crystal display device using an MIM nonlinear device with improved a nonlinear characteristic and resistance characteristic in the OFF state.

SUMMARY OF THE INVENTION

According to the present invention, a manufacturing method is provided of an MIM nonlinear device comprising a first conductive layer, an oxidation film and a second conductive layer. The method comprises the steps of forming the first conductive layer on the substrate, forming the oxidation film on the first conductive layer, performing heat treatment to the substrate on which the first conductive layer and the oxidation film have been formed in the atmosphere containing water vapor, and after the heat treatment, forming the second conductive layer on the oxidation film.

By conducting heat treatment to the substrate having the first conductive layer and the oxidation film in the atmosphere which contains water vapor, the nonlinear characteristic of the MIM nonlinear device is improved, as well as improving the resistance characteristic in the OFF state. If the MIM nonlinear device is used as a switching device of a liquid crystal display device, excellent image quality with high contrast can be achieved.

Since the resistance value in the OFF state is adequately high, a margin can be taken for the increased off-leak at a high temperature. Thus, MIM nonlinear device having a good temperature characteristic, and a liquid crystal display device using such MIM nonlinear device, can be provided.

This manufacturing method is suitable to manufacture of a MIM nonlinear device in which the first conductive layer is made of Ta achieving a great effect. The same effect can be obtained from the application to MIM nonlinear device in which the first conductive layer contains Ta as the major component, with at least one element selected from the group of W, Re and Mo added thereto.

Especially when the invention is applied to a MIM nonlinear device in which the anodic oxidation film is formed on the first conductive layer, significant effects can be obtained. In particular, when the first conductive layer is composed of Ta, or contains Ta as the major component, with at least one element selected from the group of W, Re and Mo added thereto, a remarkable effect is obtained.

The oxidation film formed on the first conductive layer may be formed by CVD, sputtering, a sol-gel process, heat oxidation, etc., other than anodic oxidation.

The second conductive layer is preferably a metal layer. Cr, Ti, Al or Mo are preferable as the material of the metal layer, and a Cr layer is especially preferable.

Preferably, the gas which contains water vapor is the air because it simplifies the structure of the heat treatment furnace.

It is also preferable that the gas which contains water vapor is mixed gas of water vapor and inert gas. When using the mixed gas of water vapor and inert gas, the ratio of the water vapor in the mixed gas can be easily controlled, which further facilitates controlling the heat treatment conditions in the gas atmosphere which contains water vapor. The inert gas is preferably nitrogen gas. This also makes the structure of the heat treatment furnace simple.

The gas which contains water vapor may be introduced to the reactor by ejecting water as a mist into the inert gas and introducing the gas with water vapor through a narrow tube. Alternatively, water may be dropped into the reactor directly, and water vapor evaporated in the reactor may be used to give water vapor to the gas.

The concentration of water vapor in the gas is preferably equal to or more than 0.014 mol % with regard to the entire gas which contains water vapor. However, water vapor content of more than 0.005 mol % also has the similar effect, and water vapor content of more than 0.001 mol % still has the effect.

The time taken for the heat treatment of the substrate having the first conductive layer and the oxidation film formed thereon in the atmosphere which contains water vapor is preferably more than 10 seconds. More preferably, it is more than 2 minutes, and further preferably is more than 5 minutes.

The step of heat-treating the substrate having the first conductive layer and oxidation film formed thereon in the atmosphere which contains water vapor is preferably the final temperature drop stage of the entire heat treatment process for the substrate on which the first conductive layer and the oxidation film are formed.

Preferably, the final temperature drop step (i.e., heat treatment in the atmosphere which contains water vapor) includes at least a temperature drop to 220° C. Taking into account the temperature distribution or the margin of the apparatus, it is preferable to continue the heat treatment in the atmosphere which contains water vapor until the temperature drops to below 200° C. It is also preferable for the temperature for forming the second conductive layer on the oxidation film after the heat treatment to be below 220° C.

The temperature drop rate during the final temperature drop step is preferably from 0.1° C./min to 60° C./min, more preferably from 0.5° C./min to 40° C./min, and further preferably, 0.5° C./min to 10° C./min. During the final temperature drop step, the temperature may be maintained constant for a while, or the temperature may be slightly increased halfway. The temperature drop rate mentioned above is the average rate including these variations in the temperature drop step.

If the final temperature drop step is a step of lowering the temperature from the first temperature to the second temperature, the method further comprises a step of performing heat treatment to the substrate, on which the first conductive layer and the oxidation film were formed at a temperature above the first temperature, in the atmosphere which contains water vapor.

If the final temperature drop step is a step of lowering the temperature from the first temperature to the second temperature, the method may further comprise a step of performing heat treatment to the substrate on which the first conductive layer and the oxidation film were formed at a temperature above the first temperature, in the atmosphere of inert gas. If this is the case, the inert gas is preferably nitrogen gas.

By conducting the heat treatment to the substrate, on which the first conductive layer and the oxidation film were formed at a temperature higher than the first temperature (final temperature drop starting temperature), in the atmosphere which contains water vapor, or in the atmosphere of inert gas such as nitrogen, higher $\beta$ value and higher resistance value in the OFF state can be obtained. The heat treatment temperature above the first temperature is preferably below 600° C., more preferably, below 500° C., further preferably, below 450° C.

If the temperature drop rate is made small, $\beta$ value, which is a nonlinear parameter of the MIM nonlinear device, and the resistance value in the OFF state can be remarkably improved. Generally, the higher the heat treatment temperature, the higher the $\beta$ value and the OFF state resistance value. However, since the $\beta$ value and the OFF state resistance value are remarkably improved by making the temperature drop rate small, satisfactory $\beta$ value and the OFF state resistance value, which are suitable for practical use, can be obtained even when the heat treatment temperature over the first temperature (i.e., temperature drop starting point) in the atmosphere containing water vapor or in the inert gas atmosphere is lowered. Lowering the heat treatment temperature reduces the compaction (contraction) of the substrate (glass substrate, etc.), and as a result, the preciseness in fine processing and assembling of the liquid crystal display device is improved. The lower heat treatment temperature can also restrain the damage on the MIM nonlinear device due to the thermal stress.

In another aspect of the invention, an MIM nonlinear device, which comprises a first conductive layer, an oxidation film, and the second conductive layers, is provided. The oxidation film has such a characteristic that the peak P2 shown in FIG. 12 is clearly observed through the measurement by thermal desorption spectrum.

The MIM nonlinear device having a first conductive layer, an oxidation film and a second conductive layer is manufactured by the method comprising the steps of forming the first conductive layer on the substrate; forming the oxidation film on the first conductive layer; performing heat treatment to the substrate, on which the first conductive layer and the oxidation film have been formed, in the atmosphere containing water vapor; and after that, forming the second conductive layer on the oxidation film. In the step of forming the second conductive layer, the second conductive layer is formed on the oxidation film having the peak P2 shown in FIG. 12, which is clearly observed through the measurement by thermal desorption spectrum.

The MIM nonlinear device has a superior nonlinear characteristic and a high resistance value in the OFF state. Using this MIM nonlinear device, an excellent liquid crystal display device is provided, which has a high contrast and a good temperature characteristic.

The liquid crystal display device of the invention is characterized in using a MIM nonlinear device as a pixel switching device, the MIM nonlinear device being fabricated by a method comprising the steps of forming the first conductive layer on the substrate; forming the oxidation film on the first conductive layer; conducting heat treatment to the substrate, on which the first conductive layer and the oxidation film have been formed, in the atmosphere which contains water vapor; and after the heat treatment, forming the second conductive layer on the oxidation film. The liquid crystal device has a high contrast and a good temperature characteristic.

Preferred Embodiment

The preferred embodiment of the invention will be described below based on the actual examples with reference to the drawings.

(EXAMPLE 1)

Figure 2:
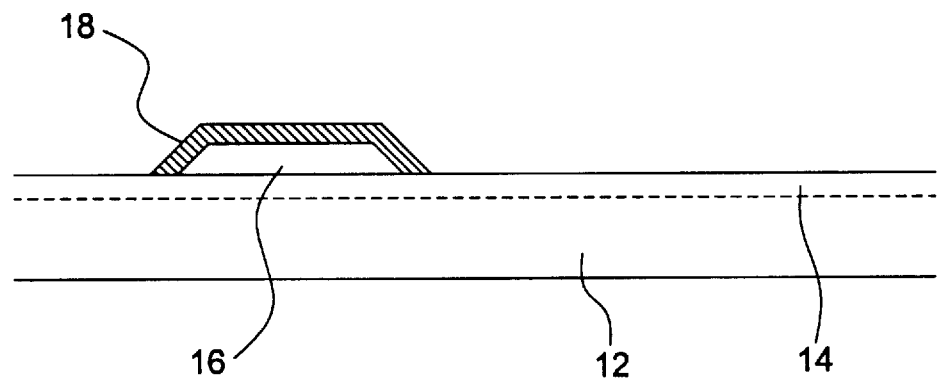
FIG. 2 is a cross-sectional view of a MIM nonlinear device used for explaining a manufacturing process of the MIM nonlinear device of Examples 1 through 12 of the invention, comparison examples, and the conventional MIM nonlinear device.

As shown in FIG. 2, tantalum film was deposited by sputtering on the transparent substrate 12 made of non-alkali glass, which was then subjected to heat oxidation to form a tantalum oxide film 14 with a thickness of about 1000 Å. The tantalum oxide film 14 is provided for the purpose of improving the contact between non-alkali glass transparent substrate 12 and Ta electrode layer 16.

Next, tantalum film was deposited by sputtering up to 2000 Å, which was patterned to form Ta electrode layer 16. Anodic oxidation was performed to the Ta electrode layer 16 to form $Ta_2O_5$ anodic oxidation film 18 with a thickness 600 Å. In the example, citric acid aqueous solution having a concentration of 0.05 weight percent was used as electrolytic solution. The anodic oxidation voltage was 31V, and the electric current density was $0.04mA/cm^2$.

Then, heat treatment was performed to the transparent substrate 12 on which the Ta electrode layer 16 and $Ta_2O_5$ anodic oxidation film 18 were formed.

Figure 3:
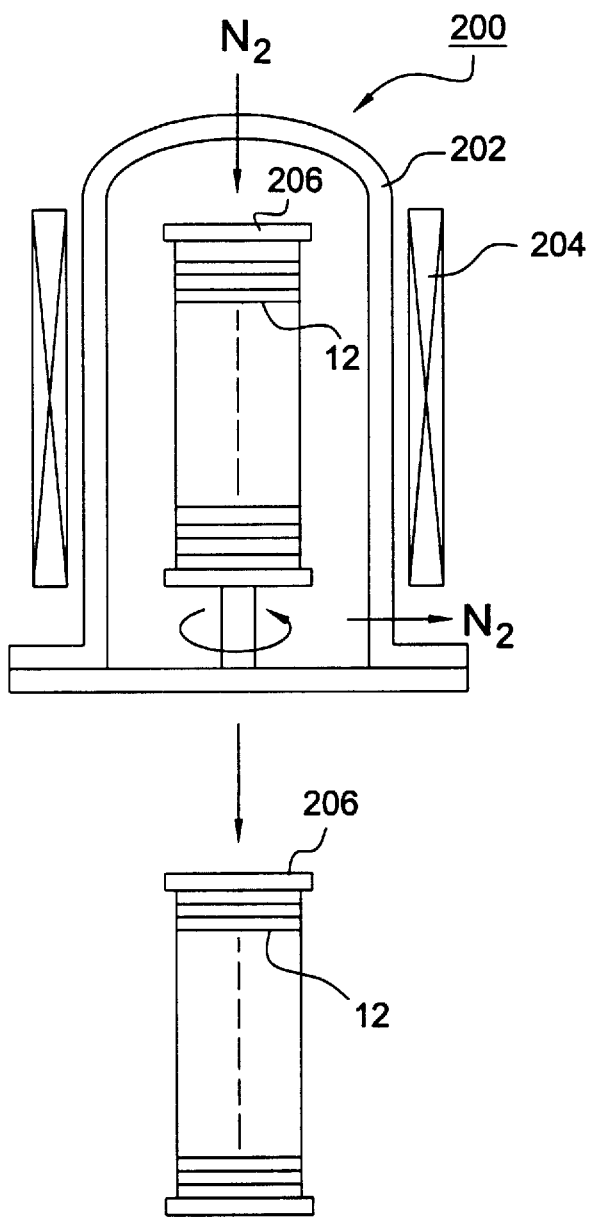
FIG. 3 is a cross-sectional view of the heat treatment furnace used in Examples 1 and 2 of the invention and in the comparison examples.

The heat treatment was carried out using the lengthwise heat treatment furnace 200 shown in FIG. 3. Bell jar 202 of the heat treatment furnace 200 contains a boat 206 to hold a plurality of transparent substrates 12. Heater 204 heats the bell jar 202, and gas is introduced into the bell jar 202 from the top thereof and discharged from the side and bottom of the bell jar 202.

In this example, forty (40) transparent substrates 12 were loaded onto the boat 206, and the boat 206 supporting the transparent substrates 12 was inserted into bell jar 202 from the bottom of the bell jar 202. $N_2$ gas was introduced into bell jar 202 from the top to create nitrogen atmosphere inside the bell jar 202 prior to starting the heat treatment. Heat treatment was performed while rotating the boat 206. Heater 204 started heating, while maintaining $N_2$ gas flow at a rate of 20l/min, to raise the temperature until the temperature of the transparent substrate 12 reached 435° C., at a temperature increasing rate 5° C./min. Then, the temperature of the transparent substrate 12 was maintained at 435° C. for two hours, still maintaining the $N_2$ gas flow at a rate of 20l/min. After that, the boat 206 supporting the transparent substrates 12 was removed from the bottom of the bell jar 202 into the atmosphere for rapid cooling of the transparent substrate in the air.

Figure 1:
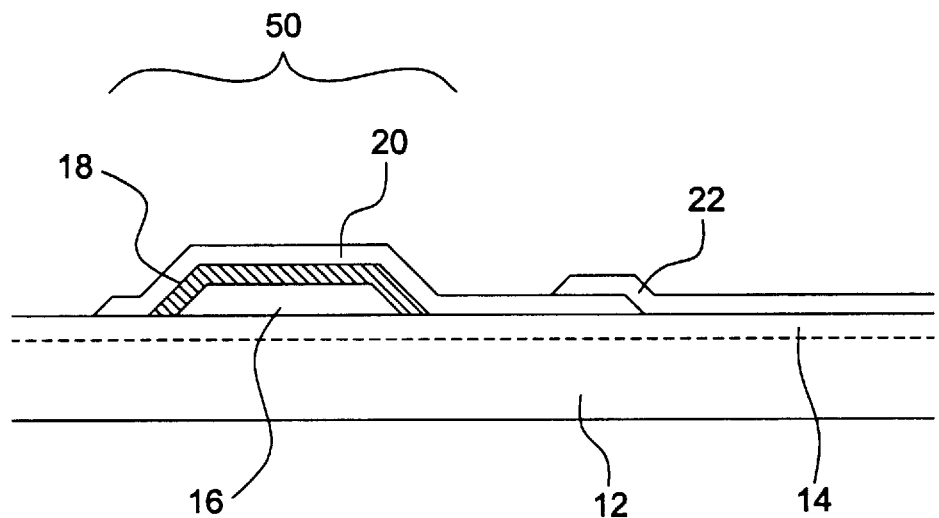
FIG. 1 is a cross-sectional view of a MIM nonlinear device used for explaining a manufacturing process of the MIM nonlinear device of Examples 1 through 12 of the invention, comparison examples, and the conventional MIM nonlinear device.

Then, as shown in FIG. 1, Cr film with a thickness 1000 Å was formed by sputtering on the $Ta_2O_5$ anodic oxidation film 18. The Cr film was patterned to form a Cr electrode layer 20. Thus, the MIM nonlinear device 50 was completed comprising Ta electrode layer 16, $Ta_2O_5$ anodic oxidation film 18 and Cr electrode layer 20.

Using the MIM nonlinear device 50 formed on the transparent substrate, the nonlinear parameter β, the ON state resistance and the OFF state resistance were measured. In this context, the nonlinear parameter β is the slope of the line plotting the logarithm of the quotient of electric current I and applied voltage V (i.e., log(I/V)), as a function of the root of the applied voltage V (i.e., $V^{1/2}$). The ON state resistance is a resistance ($\Omega$) measured with 10V voltage applied to the MIM nonlinear device and is represented as R10V. The OFF state resistance is a resistance ($\Omega$) measured with 4V voltage applied to the MIM nonlinear device and is represented as R4V. In this example, the parameter $\beta$ and ON and OFF state resistance values were measured for three transparent substrates and the average of three substrates was obtained. As a result of the measurement, $\beta$ was 4.10, ON state resistance was $5.00 \times 10^9 \Omega$, and OFF state resistance was $3.50 \times 10^{12} \Omega$.

(EXAMPLE 2)

The transparent substrate 12, on which the Ta electrode layer 16 and the $Ta_2O_5$ anodic oxidation film 18 were formed thereon, was prepared under the same conditions as the first example. Then, heat treatment was performed to the transparent substrate 12 in similar manner to the first example. Although, in the first example the transparent substrate 12 was maintained at 435° C. for two hours in the $N_2$ gas atmosphere the temperature of the transparent substrate 12 was maintained at 455° C. for two hours in the $N_2$ gas atmosphere in the second example. All the other conditions were the same as the first example including the rapid cooling in the air.

The MIM nonlinear device 50 was formed similarly to the first example. Then, the nonlinear parameter $\beta$ and the resistance values of the ON state and OFF state were measured in the same manner as the first example to obtain the average of three transparent substrates 12. $\beta$ was 5.06, the ON state resistance was $1.07 \times 10^{10} \Omega$, and the OFF state resistance was $1.19 \times 10^{13} \Omega$.

In the first and second examples, the water vapor concentration in the air was 1.2 mole % with respect to the entire air which contains water vapor.

(EXAMPLE 3)

The transparent substrate 12 having the Ta electrode layer 16 and $Ta_2O_5$ anodic oxidation film 18 formed thereon was prepared under the same conditions as the first example.

Figure 4:
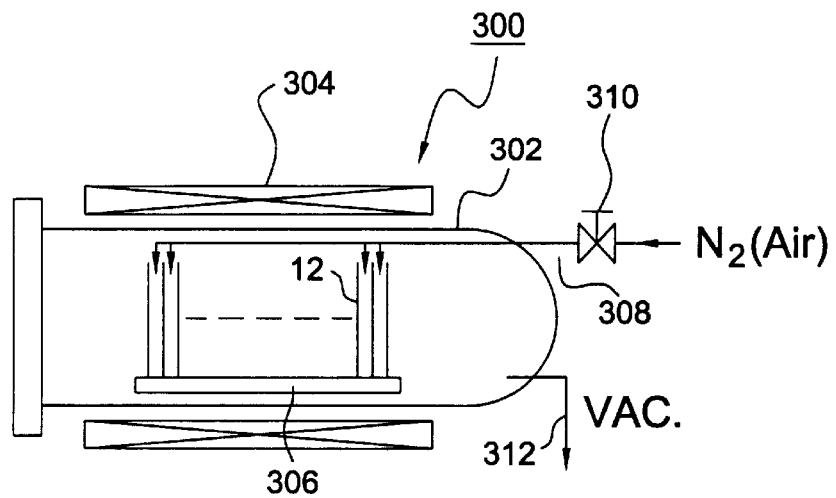
FIG. 4 is a cross-sectional view of the heat treatment furnace used in Examples 3 through 8 and Example 12.

Heat treatment was performed to the transparent substrate 12 on which the Ta electrode layer 16 and the $Ta_2O_5$ anodic oxidation film 18 are formed. The heat treatment was carried out using a sideways heat treatment furnace 300 of FIG. 4. As shown in FIG. 4, boat 306 is provided within the reactor tube 302 in the heat treatment furnace. Plural transparent substrates 12 are loaded on the boat 306 lengthwise. Heater 304 is used for the heat treatment, and gas is introduced into the reactor tube 302 through the gas induction pipe 308 provided on the upper part of the reactor tube 302, and discharged through the exhaust pipe 312 on the lower part of the reactor tube 302.

In the example, the reactor tube 302 was heated while introducing $N_2$ gas in the reactor tube 302 until the temperature reached 250° C. The $N_2$ gas atmosphere was maintained within the reactor tube 302 at 250° C. Then, the boat 306 supporting one hundred transparent substrates 12 was inserted in the reactor tube 302 in which the $N_2$ gas atmosphere is maintained at 250° C., from the left of the figure. After that, the valve 310 was closed to evacuate the $N_2$ gas from the reactor tube 302 through the exhaust pipe 312 while maintaining the temperature at 250° C. The valve 310 was opened and $N_2$ gas was introduced again into the reactor tube 302 through the gas induction pipe 308 to fill the reactor tube 302 with $N_2$ gas. Heater 304 started heating again to raise the temperature at a rate of 5° C./min until the temperature of the transparent substrate 12 reached 450° C., while introducing $N_2$ gas through the gas induction pipe 308 at a flow rate of 50 l/min and discharging through the exhaust pipe 312 provided on the lower portion of the reactor tube 302. The transparent substrate 12 was maintained at 450° C. for two hours, still maintaining the $N_2$ gas flow at a rate of 50 l/min. After that, valve 310 was closed at 450° C. and $N_2$ gas was evacuated from the reactor tube 302 through the exhaust pipe 312. Then, the valve 310 was opened to introduce the air in the reactor tube 302 through the gas induction pipe 308 to fill the reactor tube 302 with the air atmosphere. The temperature was lowered to 250° C. at a rate of 1.3° C./min, while maintaining the air atmosphere and the atmospheric pressure in the reactor tube 302. When the temperature of the transparent substrate 12 became lower than 150° C., the boat 306 supporting the transparent substrates 12 was taken out from the reactor tube 302 from the left of the figure.

Then, similarly to the first example, the MIM nonlinear device 50 was completed comprising Ta electrode layer 16, $Ta_2O_5$ anodic film 18 and Cr electrode layer 20.

The nonlinear parameter $\beta$ and the ON state and OFF state resistance values of the MIM nonlinear device 50 formed on the transparent substrate 12 were measured in the same manner as the first example and the average of the three transparent substrates 12 was obtained. The value of $\beta$ was 9.06, the ON state resistance was $2.02 \times 10^{11} \Omega$, and the OFF state resistance was $2.45 \times 10^{14} \Omega$. The variation of the values of $\beta$, the ON state resistance and the OFF state resistance was very small both on the surface of the transparent substrate and among the transparent substrates compared with the first and second examples.

By using the atmospheric air as the gas which contains water vapor, the apparatus can be simplified.

Since the heat treatment in the $N_2$ gas atmosphere and the cooling (temperature drop) in the air are continuously carried out in the same heat treatment furnace 300, controllability under the substrate cooling conditions is remarkably improved, and as a result, the variation in the characteristics of the MIM nonlinear device can be restrained within a substrate, among substrates, and among heat treatment batches.

During the continuous process in the same heat treatment furnace 300, $N_2$ gas is evacuated from the heat treatment furnace after the heat treatment of the substrate in the $N_2$, and then, the air is introduced in the heat treatment furnace 300 for cooling the substrate in the air. This makes the gas replacement easy and the heat treatment atmosphere can be changed-over reliably in a short time, resulting in facilitated control of the heat treatment conditions and improved controllability. As a result, variation in the characteristics of the MIM nonlinear device can be further restrained within a substrate, among substrates and among heat treatment batches.

(EXAMPLE 4)

The transparent substrate 12 on which the Ta electrode layer 16 and $Ta_2O_5$ anodic oxidation film 18 were formed was prepared under the same conditions as the first example. Then, the heat treatment of the transparent substrate 12 was carried out in the similar manner to the third example. Although, in the third example, the transparent substrate 12 was maintained at 450° C. for two hours in the $N_2$ atmosphere, the temperature of the transparent substrate 12 was maintained at 410° C. for two hours in the $N_2$ atmosphere. All the other conditions were the same as the third embodiment.

The MIM nonlinear device 50 was formed similarly to the first example, and the nonlinear parameter β, the ON state resistance and the OFF state resistance of the MIM nonlinear device 50 formed on the transparent substrate 12 were measured in the same manner as the first example to obtain the average of the three transparent substrates 12. The value of β was 9.22, the ON state resistance was $4.94 \times 10^{10} \Omega$ and the OFF state resistance was $9.28 \times 10^{13} \Omega$. The variation in the values of β, the ON state resistance and the OFF state resistance was very small both on the surface of the transparent substrate and among the transparent substrates compared with the first and second examples.

(EXAMPLE 5)

The transparent substrate 12 on which the Ta electrode layer 16 and $Ta_2O_5$ anodic oxidation film 18 were formed was prepared under the same conditions as the first example. Then, the heat treatment of the transparent substrate 12 was carried out in similar manner to the third example. Although, in the third example the transparent substrate 12 was maintained at 450° C. for two hours in the $N_2$ atmosphere, the temperature of the transparent substrate 12 was maintained at 380° C. for two hours in the $N_2$ atmosphere. All the other conditions were the same as the third example.

The MIM nonlinear device 50 was formed similarly to the first example and the nonlinear parameter β, the ON state resistance and the OFF state resistance of the MIM nonlinear device 50 formed on the transparent substrate 12 were measured in the same manner as the first example to obtain the average of the three transparent substrates 12. The value of β was 7.84, the ON state resistance was $1.96 \times 10^{10} \Omega$, and the OFF state resistance was $2.61 \times 10^{14} \Omega$. The variation in the values of β, the ON state resistance and the OFF state resistance was very small both on the surface of the transparent substrate and among the transparent substrates compared with the first and second examples.

(EXAMPLE 6)

The transparent substrate 12 on which the Ta electrode layer 16 and the $Ta_2O_5$ anodic oxidation film 18 were formed was prepared under the same conditions as the first example. Then, the heat treatment of the transparent substrate 12 was carried out in similar manner to the third example. Although, in the third example, the transparent substrate 12 was maintained at 450° C. for two hours in the $N_2$ atmosphere, the temperature of the transparent substrate 12 was maintained at 350° C. for two hours in the $N_2$ atmosphere. All the other conditions were the same as the third example.

The MIM nonlinear device 50 was formed similarly to the first example and the nonlinear parameter β, the ON state resistance and the OFF state resistance of the MIM nonlinear device 50 formed on the transparent substrate 12 were measured in the same manner as the first example to obtain the average of the three transparent substrates 12. The value of β was 6.07, the ON state resistance was $1.01 \times 10^{10} \Omega$ and the OFF state resistance was $7.45 \times 10^{13} \Omega$. The variation in the values of β, the ON state resistance and the OFF state resistance was very small both on the surface of the transparent substrate and among the transparent substrates compared with the first and second examples.

(EXAMPLE 7)

The transparent substrate 12 on which Ta electrode layer 16 and $Ta_2O_5$ anodic oxidation film 18 were formed was prepared under the same conditions as the first example. Then, the heat treatment of the transparent substrate 12 was carried out in similar manner to the third example. Although, in the third example, the transparent substrate 12 was maintained at 450° C. for two hours in the $N_2$ atmosphere, the temperature of the transparent substrate 12 was maintained at 320° C. for two hours in the $N_2$ atmosphere. All the other conditions were the same as the third example.

The MIM nonlinear device 50 was formed similarly to the first example and the nonlinear parameter β, the ON state resistance and the OFF state resistance of the MIM nonlinear device 50 formed on the transparent substrate 12 were measured in the same manner as the first example to obtain the average of three transparent substrates 12. The value of β was 4.40, the ON state resistance was $3.17 \times 10^9 \Omega$, and the OFF state resistance was $2.95 \times 10^{12} \Omega$. The variation in the values of β, the ON state resistance and the OFF state resistance was very small both on the surface of the transparent substrate and among the transparent substrates compared with the first and second examples.

(EXAMPLE 8)

The transparent substrate 12 on which Ta electrode layer 16 and $Ta_2O_5$ anodic oxidation film 18 were formed was prepared under the same conditions as the first example. Then, the heat treatment of the transparent substrate 12 was carried out in similar manner to the third example. Although, in the third example, the transparent substrate 12 was maintained at 450° C. for two hours in the $N_2$ atmosphere, the temperature of the transparent substrate 12 was maintained at 290° C. for two hours in the $N_2$ atmosphere. All the other conditions were the same as the third example.

The MIM nonlinear device 50 was formed similarly to the first example and the nonlinear parameter β, the ON state resistance and the OFF state resistance of the MIM nonlinear device 50 formed on the transparent substrate 12 were measured in the same manner as the first example to obtain the average of the three transparent substrates 12. The value of β was 3.62, the ON state resistance was $1.90 \times 10^9 \Omega$ and the OFF state resistance was $3.93 \times 10^{11} \Omega$. The variation in the values of β, the ON state resistance and the OFF state resistance was very small both on the surface of the transparent substrate and among the transparent substrates compared with the first and second examples.

In the first through eighth examples, the concentration of water vapor in the air introduced in the reactor tube 302 was 1.2 mole % with respect to the entire air which contains water vapor.

(EXAMPLE 9)

The transparent substrate 12 on which the Ta electrode layer 16 and the $Ta_2O_5$ anodic oxidation film were formed was prepared under the same conditions as the first example.

Figure 5:
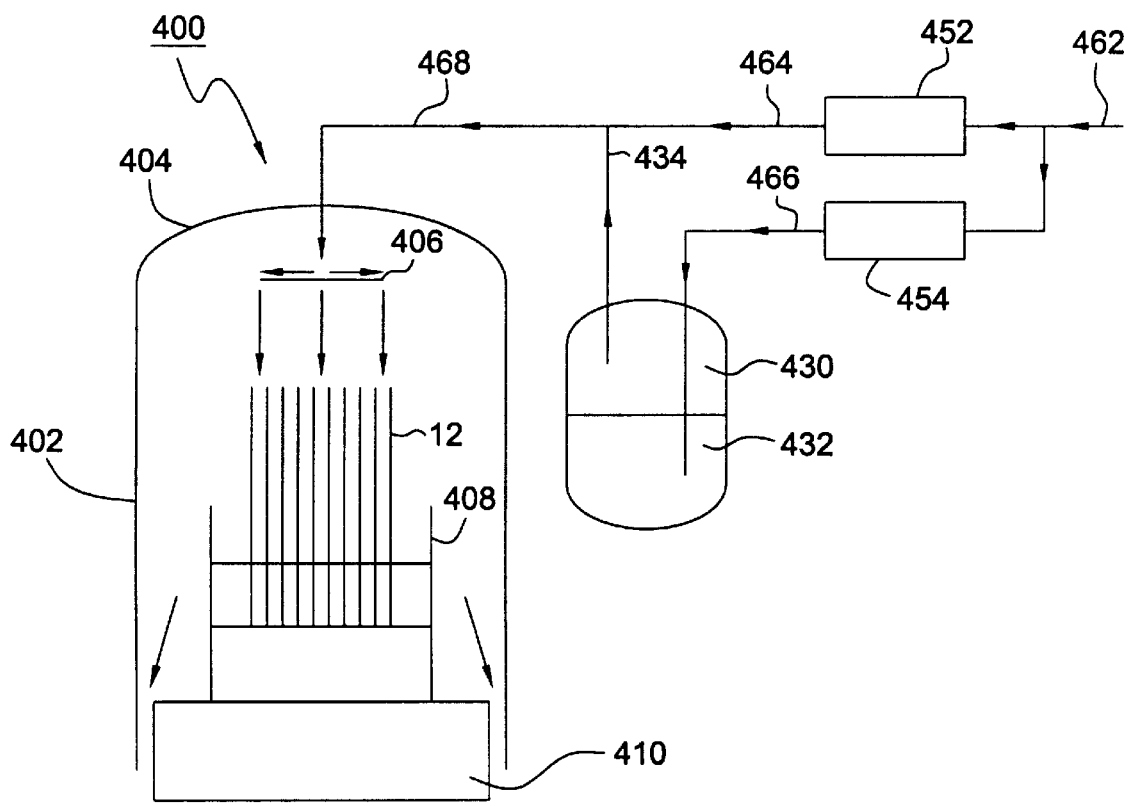
FIG. 5 shows the heat treatment furnace used in Examples 9 through 11.

Then, heat treatment was performed to the transparent substrate 12 having the Ta electrode layer 16 and the $Ta_2O_5$ anodic oxidation film formed thereon. The lengthwise heat treatment furnace 400 shown in FIG. 5 was used for the heat treatment.

The temperature in the bell jar 402 was raised to 250° C., while introducing the $N_2$ gas in the bell jar 402 through the gas induction pipe 462, mass flow controller 452, and pipes 464, 468 so that the inside of the bell jar 402 was maintained at 250° C. in the $N_2$ gas atmosphere.

Boat 408 holding twenty (20) transparent substrates 12 was inserted in the bell jar 402 which contains the $N_2$ gas at 250° C., through the bottom of the bell jar 402.

Then, the heater (not shown) started heating the bell jar 402 while introducing the $N_2$ gas at a rate of 20l/min from the top 404 of the bell jar 402 through the gas induction pipe 462, mass flow controller 452, and pipes 464, 468 to raise the temperature at a rate of 3° C./min until the temperature of the transparent substrate 12 reached 350° C.

The temperature of the transparent substrate 12 was maintained at 350° C. for two hours while maintaining the flow rate of the $N_2$ gas 20l/min.

After that, mass flow controller 452 reduced the $N_2$ gas flow rate in the pipe 464 to 10l/min at 350° C. At the same time, mass controller 454 reduced the $N_2$ gas flow rate in the pipe 466 for introducing the $N_2$ gas into the bubbler 430 containing pure water 432 to 10l/min at 350° C. so that the $N_2$ gas which contains water vapor flows out at 10l/min through the pipe 434. $N_2$ gas of 10l/min from the pipe 464 and $N_2$ gas, which contains water vapor, of 10l/min from the pipe 434 were mixed together in the pipe 468 and the mixed gas was introduced in the bell jar 402 from the top 404 of the bell jar 402. In this state (with the flow of $N_2$ gas which contains water vapor), the temperature was lowered from 350° C. to 250° C. at a rate of 0.8° C./min.

In this example, the temperature of the bubbler 430 was maintained at 22° C., and the water vapor concentration in the $N_2$ gas, which was introduced into the bell jar 402 from the top 404 thereof through the pipe 468, was set to 2.6 mole % with respect to the entire $N_2$ gas which contains water vapor.

When the temperature of the transparent substrate 12 reached 250° C., the boat 408 supporting the transparent substrates 12 was pulled down from the bottom of the bell jar 402.

Then, the MIM nonlinear device 50 comprising Ta electrode layer 16, the $Ta_2O_5$ anodic oxidation film 18 and the Cr electrode layer 20 was completed in the same manner as the first example.

Using the MIM nonlinear device 50 formed on the transparent substrate 12, the nonlinear parameter β, the ON state resistance and the OFF state resistance of the MIM nonlinear device 50 were measured for three transparent substrates and the average was calculated. The β value was 6.50, the ON state resistance was $1.60 \times 10^{10} \Omega$, and the OFF state resistance was $1.02 \times 10^{14} \Omega$. The variation in the values of β, the ON state resistance and the OFF state resistance was very small both on the surface of the transparent substrate and among the transparent substrates compared with the first and second examples.

By using the mixture of water vapor and $N_2$ gas as the gas which contains water vapor, the ratio of the water vapor contained in the mixed gas is easily controlled, which facilitates the control of the heat treatment conditions in the water vapor containing gas atmosphere. In the example, a bubbler is used to supply water vapor, and the ratio of the water vapor in the mixed gas is easily set by controlling the temperature of the bubbler.

(Comparison Example)

The transparent substrate 12 on which the Ta electrode layer 16 and the $Ta_2O_5$ anodic oxidation film 18 were formed was prepared under the same conditions as the first example. Then, heat treatment was performed to the transparent substrate 12 using the lengthwise heat treatment furnace 200 shown in FIG. 3. In this comparison example, forty (40) transparent substrates 12 were loaded on the boat 206 and the boat was inserted into the bell jar 202 from the bottom thereof. After the bell jar 202 was filled with the nitrogen atmosphere by introducing $N_2$ gas from the top of the bell jar 202, heat treatment started. The heat treatment was carried out using the heater 204, while rotating the boat 206 in the bell jar 202. The heater 104 started heating to raise the temperature at a rate of 5° C./min until the temperature of the transparent substrate 12 reached 450° C., while maintaining the $N_2$ gas flow at a rate of 20l/min. The temperature of the transparent substrate 12 was maintained at 450° C. for two hours still maintaining the $N_2$ gas flow at a rate of 20l/min. Then, the temperature was lowered to 250° C. at a rate of 1° C./min under the $N_2$ gas flow at a rate of 20l/min. When the temperature reached 250° C., the boat 206 supporting the transparent substrates 12 was removed from the bell jar 202 through the bottom thereof.

After that, the Cr electrode layer 20 was formed in the same manner as the first example to complete the MIM nonlinear device comprising the Ta electrode layer 16, the $Ta_2O_5$ anodic oxidation film 18 and the Cr electrode layer 20.

Similarly to the first example, the nonlinear parameter β, the ON state resistance and the OFF state resistance of the MIM nonlinear device 50 were measured for the three transparent substrates and the average was calculated. The β value was 3.10, the ON state resistance was $1.2 \times 10^9 \Omega$ and the OFF state resistance was $4.05 \times 10^{10} \Omega$.

Figure 6:
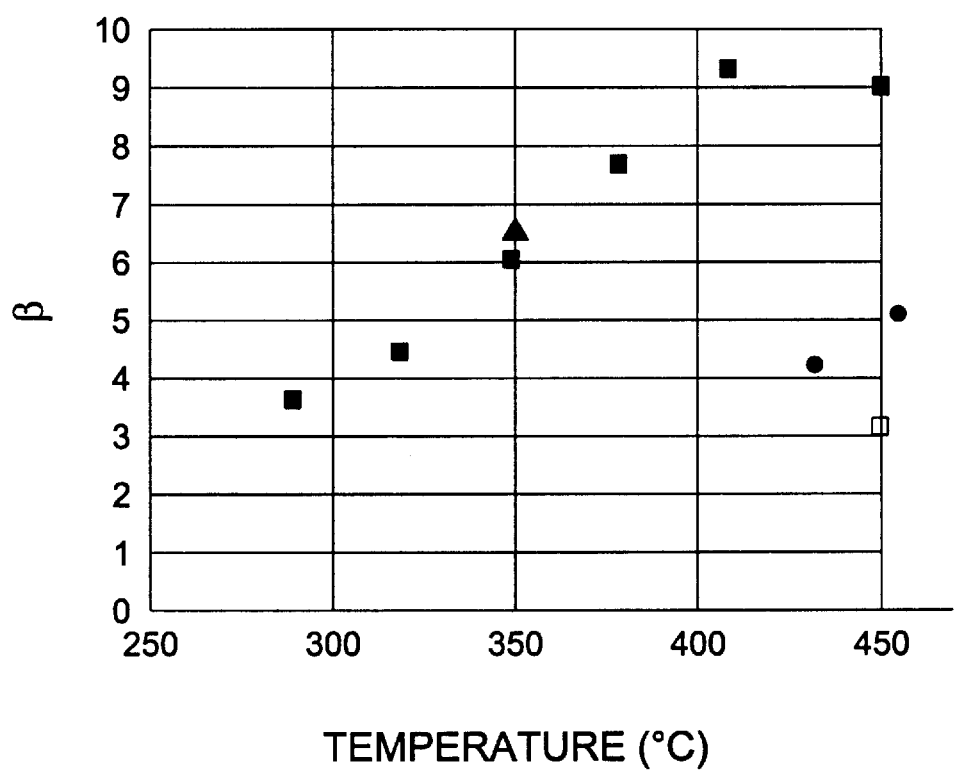
FIG. 6 is a chart showing the β values of the MIM nonlinear devices of Examples 1 through 9 and of the comparison example, as a function of the temperature.

FIG. 6 is a chart in which the β values of the first through ninth examples and the comparison example are plotted. The horizontal axis represents the heat treatment temperature in the $N_2$ gas. Symbol ● denotes the β values obtained in the first and second examples, symbol ■ denotes the β values of the third through eighth examples, the black triangle denotes the β value of the ninth example, and symbol □ denotes the β value of the comparison example. From the chart, it can be seen that lowering the temperature of the transparent substrate in the gas atmosphere containing water vapor can obtain improved β values as in the first through ninth examples compared with the comparison example in which the temperature was lowered only in the $N_2$ gas atmosphere without containing water vapor. Furthermore, as the heat treatment temperature is high, the β value becomes high. Slow cooling in the $N_2$ atmosphere which contains water vapor as is in the third through ninth examples indicates a higher β value even with the lower heat treatment temperature compared with the first and second examples in which rapid cooling in the air was performed. With the heat treatment temperature of 350°–450° C., the measured OFF state resistance values were close to each other because these values were all beyond the measurement limit.

With a high β value, the contrast of liquid crystal display device can be improved. If the OFF state resistance value is high, an adequate margin can be taken against the increase of OFF-leak at a high temperature, thereby achieving a MIM nonlinear device having a superior temperature characteristic, and a liquid crystal display device using such MIM nonlinear device.

Figure 7:
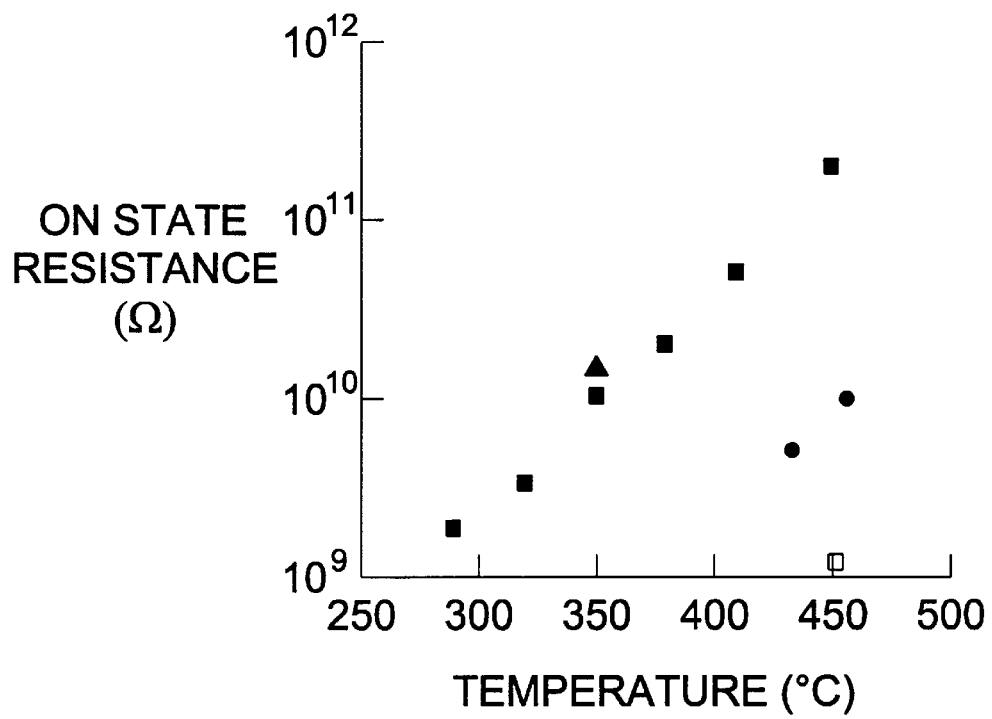
FIG. 7 is a chart showing the ON state resistance values of the MIM nonlinear device of Examples 1 through 9 and the comparison example.
Figure 8:
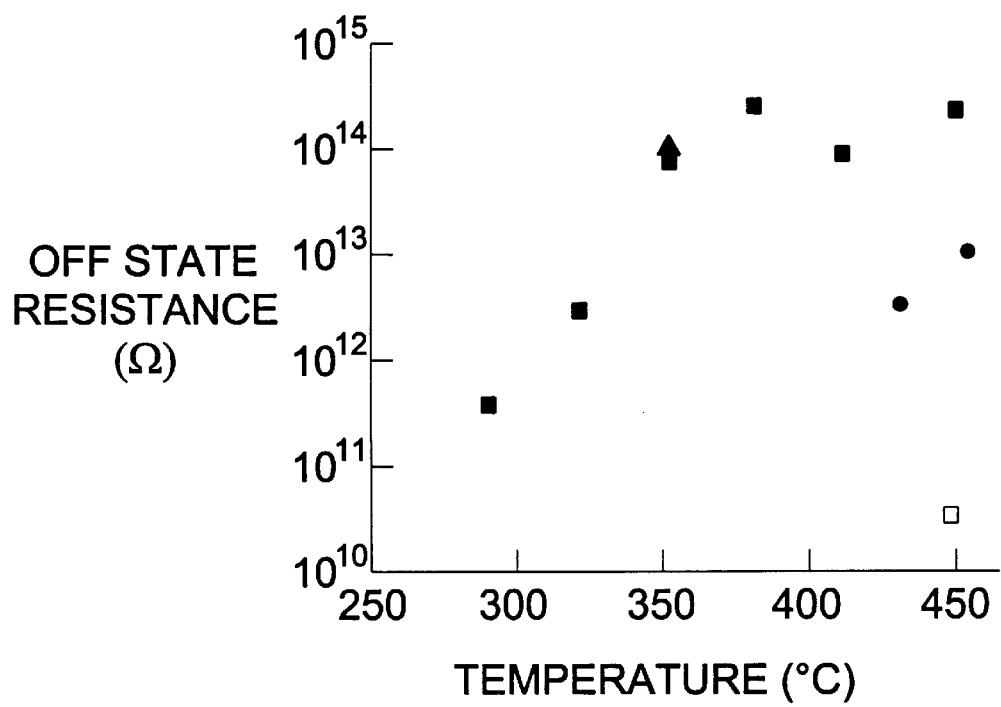
FIG. 8 is a chart showing the OFF state resistance values of the MIM nonlinear device of Examples 1 through 9 and the comparison example.

In view of FIGS. 6 through 8, after the heat treatment in the nitrogen gas atmosphere, the heat treatment temperature itself can be lowered to 350° C. by slow cooling in the air or in the $N_2$ gas which contains water vapor. This allows less-expensive soda glass to be used as a substrate. As a result, manufacturing cost of the liquid crystal device using the MIM nonlinear device manufactured in this way is also reduced.

If the heat treatment temperature is low, compaction (contraction) of the substrate (e.g. glass substrate) is reduced and preciseness in minute processing or assembling can be improved. Lower heat treatment temperature can also achieve reduced damages onto the MIM nonlinear device due to the thermal stress.

Slow cooling in the air, or in the $N_2$ gas which contains water vapor, performed after the heat treatment in the $N_2$ gas atmosphere also facilitates the temperature control during the temperature drop, whereby MOM nonlinear devices are easily manufactured with small variations in characteristics of the device among heat treatment batches.

(EXAMPLE 10)

The transparent substrate 12 on which the Ta electrode layer 16 and the $Ta_2O_5$ anodic oxidation film 18 were formed was prepared under the same conditions as the first example.

Heat treatment was performed to the transparent substrate 12 on which Ta electrode layer 16 and $Ta_2O_5$ anodic oxidation film 18 were formed. The heat treatment was carried out using the lengthwise heat treatment furnace 400 shown in FIG. 5.

In this example, the inside of the bell jar was maintained in the $N_2$ gas atmosphere at 250° C. in advance similar to the ninth example.

Boat 12 supporting twenty (20) transparent substrates 12 was inserted into the bell jar 402 which is filled with the $N_2$ gas atmosphere at 250° C. through the bottom of the bell jar 402.

Then, the heater (not shown) started heating the bell jar 402 while introducing the $N_2$ gas at a rate of 20l/min from the top 404 of the bell jar 402 through mass-flow controller 452, pipes 464, and 468, to raise the temperature at a rate of 3° C./min until the temperature of the transparent substrate 12 reached 350° C.

When the temperature of the substrate 12 reached 350° C., the $N_2$ gas which contains water vapor was then introduced into the bell jar 402 using bubbler 430, through the pipe 468 under the same conditions as Example 9. The temperature of the transparent substrate 12 was maintained at 350° C. for 90 minutes with the $N_2$ gas flow which contains water vapor.

After that, the temperature was lowered from 350° C. to 250° C. at a rate of 0.8° C./min still introducing the $N_2$ gas which contains water vapor.

When the temperature of the transparent substrate 12 reached 250° C., the boat 408 supporting the transparent substrates 12 was pulled down from the bottom of the bell jar 402.

Then, the MIM nonlinear device 50 comprising the Ta electrode layer 16, the $Ta_2O_5$ anodic oxidation film 18 and the Cr electrode layer 20 was completed in the same manner as Example 1.

Using the MIM nonlinear device 50 formed on the transparent substrate 12, the nonlinear parameter $\beta$, the ON state resistance and the OFF state resistance of the MIM nonlinear device 50 were measured for three transparent substrates and the average was calculated. The $\beta$ value was 6.87, the ON state resistance was $1.94 \times 10^{10} \Omega$ and the OFF state resistance was $7.76 \times 10^{13} \Omega$. The variation in the values of $\beta$, the ON state resistance and the OFF state resistance was very small both on the surface of the transparent substrate and among the transparent substrates compared with Examples 1 and 2.

In this example, the $N_2$ gas which contains water vapor was introduced into the bell jar at the time of starting the temperature drop in the heat treatment process. However, the $N_2$ gas which contains water vapor may be introduced during the period of constant temperature prior to the temperature drop. It can be seen from the measurement result that the characteristic values of the nonlinear device are also desirable similar to the examples in which the $N_2$ gas which contains water vapor was introduced only during the cooling (temperature drop) period. This eliminates the necessity to use a complicated process controller for introducing the $N_2$ gas which contains water vapor only during the temperature drop period and can facilitate the gas control system. This also allows an adequate margin to be obtained with respect to the introduction timing of the $N_2$ gas which contains water vapor and simplifies the apparatus structure and process controlling resulting in reduced cost.

(EXAMPLE 11)

The transparent substrate 12 on which the Ta electrode layer 16 and the $Ta_2O_5$ anodic oxidation film 18 were formed was prepared under the same conditions as the first example.

Heat treatment was performed to the transparent substrate 12 on which the Ta electrode layer 16 and the $Ta_2O_5$ anodic oxidation film 18 were formed. The heat treatment was carried out using the lengthwise heat treatment furnace 400 shown in FIG. 5.

First of all, the $N_2$ gas which contains water vapor was introduced into the bell jar 402 using bubbler 430, through the pipe 468 under the same conditions as Example 9. The inside of the bell jar 402 was maintained at 250° C. in the $N_2$ gas atmosphere which contains water vapor with the gas flow of $N_2$ which contains water vapor.

Then, boat 408 supporting twenty (20) transparent substrates 12 was inserted into the bell jar 402 which is filled with the $N_2$ gas which contains water vapor at 250° C. through the bottom of the bell jar 402.

Then, heater (not shown) started heating the bell jar 402 while introducing the $N_2$ gas which contains water vapor at a rate of 20l/min from the top 404 of the bell jar 402 to raise the temperature at a rate of 3° C./min until the temperature of the transparent substrate 12 reached 350° C.

The temperature of the transparent substrate 12 was maintained at 350° C. for 90 minutes while introducing the $N_2$ gas which contains water vapor.

After that, the temperature was lowered from 350° C. to 250° C. at a rate of 0.8° C./min still introducing the $N_2$ gas which contains water vapor.

When the temperature of the transparent substrate 12 reached 250° C., the boat 408 supporting the transparent substrates 12 was pulled down from the bottom of the bell jar 402.

Then, the MIM nonlinear device 50 comprising the Ta electrode layer 16, the $Ta_2O_5$ anodic oxidation film 18 and the Cr electrode layer 20 was completed in the same manner as Example 1.

Using the MIM nonlinear device 50 formed on the transparent substrate 12, the nonlinear parameter $\beta$, the ON state resistance and the OFF state resistance of the MIM nonlinear device 50 were measured for three transparent substrates and the average was calculated. The $\beta$ value was 5.43, the ON state resistance was $8.77 \times 10^9 \Omega$ and the OFF state resistance was $2.76 \times 10^{13} \Omega$. The variation in the values of $\beta$, the ON state resistance and the OFF state resistance was very small both on the surface of the transparent substrate and among the transparent substrates compared to Examples 1 and 2.

In this example, the $N_2$ gas which contains water vapor was introduced from the beginning of the heat treatment process. This can achieve the same desirable characteristic values of the nonlinear device as compared with the case in which the $N_2$ gas which contains water vapor was introduced only during the cooling (temperature drop) period. This eliminates the necessity to use a complicated process controller for introducing the $N_2$ gas which contains water vapor only during the temperature drop period and can facilitate the gas control system. Since the heat treatment can be started in the atmosphere which contains water vapor from the first temperature raising step, less expensive open-structured heat treatment furnace may be used instead of the diffusion furnace used in this example.

The heat treatment furnace 400 used in Examples 9 through 11 has a diffusion plate 406 comprising a disc with a plurality of holes. The furnace 400 is designed so that the gas introduced from the top 404 of the bell jar 402 passes through the diffusion plate 406 and flows toward the transparent substrates 12 loaded on the boat 408. The boat 408 is put on the quartz stage 410 which functions as a heat barrier as well as a lid. The gas introduced into the bell jar 402 from the top 404 flows out of the furnace through the gap between the bell jar 402 and the quartz stage 410.

(EXAMPLE 12)

As shown in FIG. 2, tantalum oxide film 14 with a thickness of 1000 Å was deposited by sputtering on the transparent substrate 12 made of non-alkali glass. Alternatively, the tantalum oxide film 14 may be formed by sputtering tantalum film with a thickness of 1000 Å on the transparent substrate 12 made of non-alkali glass followed by thermal oxidation.

Then, tantalum film, which contains 0.2 weight % of tungsten (W) with respect to tantalum (Ta), was formed up to 2000 Å. The tantalum film was then patterned to form a Ta electrode layer 16. The Ta electrode layer 16 was subjected to anodic oxidation to form anodic oxidation film 18 having a thickness of 48 Å, 54 Å and 60 Å, respectively. Citric acid aqueous solution was used as electrolytic solution. The anodic oxidation voltage values used for this process were 25V, 28V and 31V, respectively.

The transparent substrate 12 on which the Ta electrode layer 16 and the $Ta_2O_5$ anodic oxidation film 18 were formed was subjected to heat treatment.

The heat treatment was performed using a sideways heat treatment furnace shown in FIG. 4. Gas was introduced into the reactor tube 302 through the gas induction pipe 308 provided on the top of the reactor tube 302 and was discharged from the exhaust pipe 312.

In this example, the temperature was raised while introducing $N_2$ gas into the reactor tube 302 and the inside of the reactor tube 302 was filled with the $N_2$ gas atmosphere and maintained at 250° C. Then, boat 306 supporting a plurality of transparent substrates 12 vertically was inserted into the reactor tube 302 which is maintained at 250° C. in the $N_2$ gas atmosphere from the left of the figure. Valve 310 was then closed and the gas was evacuated from the reactor tube 302 through the exhaust pipe 312 while maintaining the temperature at 250° C. After the evacuation, the valve was opened to introduce $N_2$ gas again into the reactor tube 302 through gas induction pipe 308 to fill the reactor tube 302 with $N_2$ gas atmosphere. Heater 304 began heating to raise the temperature at a rate of 5° C./min until the temperature of the transparent substrate 12 reached 320° C. while introducing $N_2$ gas through the gas induction pipe 308 at a rate of 50l/min and discharging from the exhaust pipe 312 provided on the bottom of the reactor tube 302. The temperature of the transparent substrate 12 was maintained at 320° C. for ½ hour while maintaining the flow rate of the $N_2$ gas at 50l/min. Then, valve 310 was closed at 320° C. and the gas was evacuated from the reactor tube 302 again through the exhaust pipe 312. Valve 310 was opened to introduce mixed gas of the air and nitrogen into the reactor tube 302 through gas induction pipe 308. When the reactor tube 302 was filled with mixed gas, the temperature was lowered to 200° C. at a rate of 1.0° C./min under the atmospheric pressure. When the temperature of the transparent substrate 12 became under 150° C., boat 306 supporting transparent substrates 12 was removed from the reactor tube 302 from the left of the figure.

After that, the MIM nonlinear device 50 comprising Ta electrode layer 16, the $Ta_2O_5$ anodic oxidation film 18 and the Cr electrode layer 20 was completed in the same manner as the first example.

Similarly to the first example, the nonlinear parameter β, the ON state resistance and the OFF state resistance of the MIM nonlinear device 50 formed on the transparent substrate 12 were measured.

Figure 9:
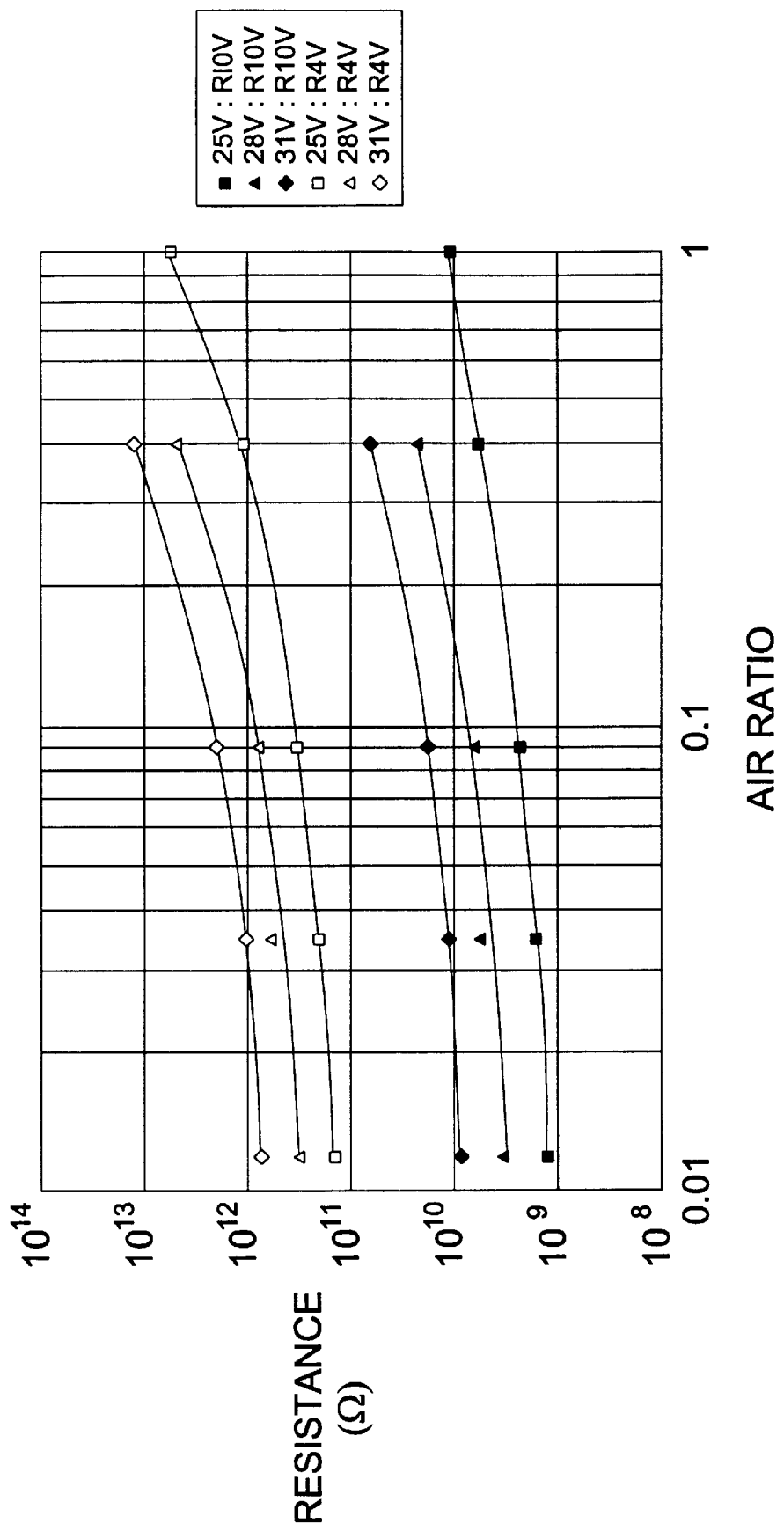
FIG. 9 is a chart showing the resistance values of the MIM nonlinear device of Example 9 in the ON and OFF states.

FIG. 9 is a chart showing the relationship between the air ratio in the mixed gas of the air and nitrogen introduced into the reactor 302 through the gas induction pipe 308 and the ON and OFF state resistance values. The air ratio is represented as (air flow)/(air flow+$N_2$ gas flow). The white square (□), white triangle (Δ) and white diamond denote the OFF state resistance values of the MIM nonlinear device 50 formed with the anodic oxidation voltage values 25V, 28V and 31V, respectively. The black square (■), black triangle and black diamond denote the ON state resistance values of the MIM nonlinear device 50 formed with the anodic oxidation voltage values 25V, 28V and 31V, respectively.

Even when the Ta electrode layer 16 is formed from the tantalum film which contains 0.2 weight % of tungsten (W) with respect to tantalum (Ta), the adequately high OFF state resistance can be obtained through a relatively low heat treatment temperature (320° C.) by using the gas which contains the air for the cooling step during the heat treatment. The β value is also desirable, which was higher than 4.3, indicating a good nonlinear characteristic sufficient for obtaining a good image quality.

The concentration of the water vapor contained in the air was 1.2 mol % with respect to the entire air. Accordingly, when the air ratio is 1, the water vapor concentration becomes 1.2 mol % with respect to the mixed gas of the air and nitrogen. When the air ratio is 0.1, the water vapor concentration becomes 0.12 mol % with respect to the mixed gas of the air and nitrogen and with the air ratio 0.01, the water vapor concentration becomes 0.0112 mol %. The lower limit of the air ratio experimental data is 0.012, and the corresponding water vapor concentration is 0.014 mol % with respect to the mixed gas of the air and nitrogen.

Although, in the example 0.2 weight % of tungsten (W) was contained in the Ta electrode layer 16, the Ta electrode layer 16 may contain 0.1 weight % of Re or 0.2 weight % of Mo. Also, the Ta electrode layer 16 which does not contain additional material added to tantalum can also achieve the same tendency of voltage-current characteristic as effective as this example.

(EXAMPLE 13)

Figure 10:
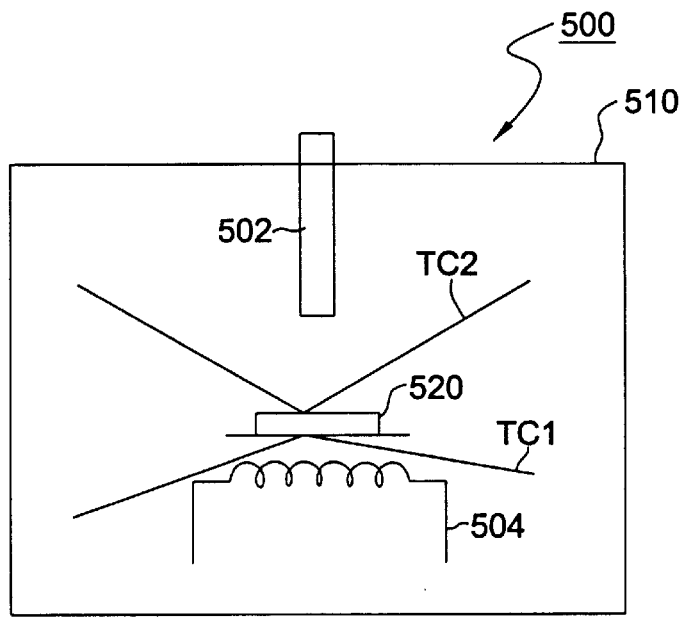
FIG. 10 is a cross-sectional diagram for explanation of the thermal desorption spectrum (TDS) apparatus used in Example 13.
Figure 11:
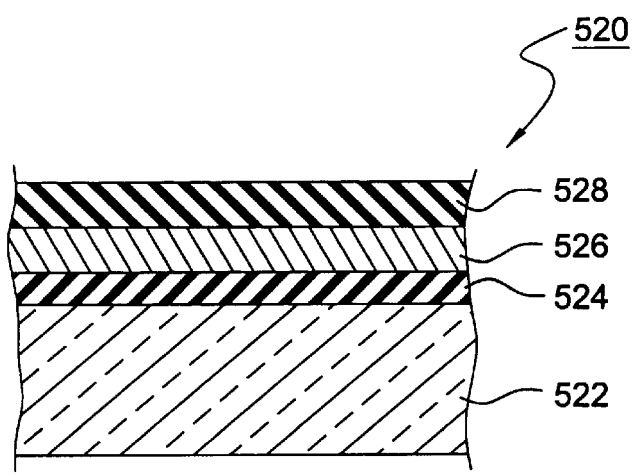
FIG. 11 is a cross-sectional diagram showing the sample used in Example 13.

Measurement was executed using a thermal desorption spectrum (TDS) technique to study the tantalum oxide film formed by the heat treatment process of the invention. Thermal desorption spectrometer 500 shown in FIG. 10 was used including a quadruple spectrometer 502 and an infrared heater 504 in the vacuum chamber 510. The sample 520 was heated from its rear surface by the infrared heater 504. The gas emitted from the sample 520 was measured by the quadruple spectrometer 502 to obtain the thermal desorption spectrum. Thermocouple TC1 was provided on the bottom side of the sample 520 for the temperature control of the sample 520 in the aspect of the thermal controllability. Thermocouple TC2 was also provided on the top side of the sample 520 to measure the surface temperature of the sample 520. Since the heat conductivity of the quartz substrate 522 used as the sample 520 is not so good and the thickness of the substrate is as thick as 1.1 mm, there was a difference in the temperature between the thermocouples TC1 and TC2.

The temperature in the actual MIM nonlinear device forming process is equal to that indicated by TC2. Although, in the actual examples the MIM nonlinear device is formed on the non-alkali glass, quartz glass was used for the TDS measurement for the purpose of ensuring the heat-resistant ability to put up with the measurement with a temperature as high as 1000° C. Even if the substrate material is changed, the voltage-current characteristic of the MIM nonlinear device formed thereon is the same.

How the sample 520 used for the measurement was obtained will be described below. Tantalum oxide film 524 with a thickness 1000 Å was formed by sputtering on the quartz substrate 522 of a thickness 1 mm. Then, tantalum film 526 was formed on the tantalum oxide film 524 by sputtering. The tantalum film 526 was subjected to anodic oxidation to form anodic oxidation film 528. The thickness of the tantalum film 426 after the anodic oxidation was 1600 Å and the thickness of the tantalum oxidation film 528 was 850 Å.

The sample 520 was then subjected to heat treatment in the same manner as the twelfth example. That is, the temperature was raised in the $N_2$ gas atmosphere until the temperature of the sample 520 reached 320° C. The temperature was maintained at 320° C. for ½ hours in the $N_2$ atmosphere. Then, the temperature was lowered to 200° C. at a rate of 1.0° C./min in the air atmosphere containing 1.2 mol % of water vapor. The sample 520 was taken out from the heat treatment furnace and was used for measurement of the thermal desorption spectrum.

Figure 12:
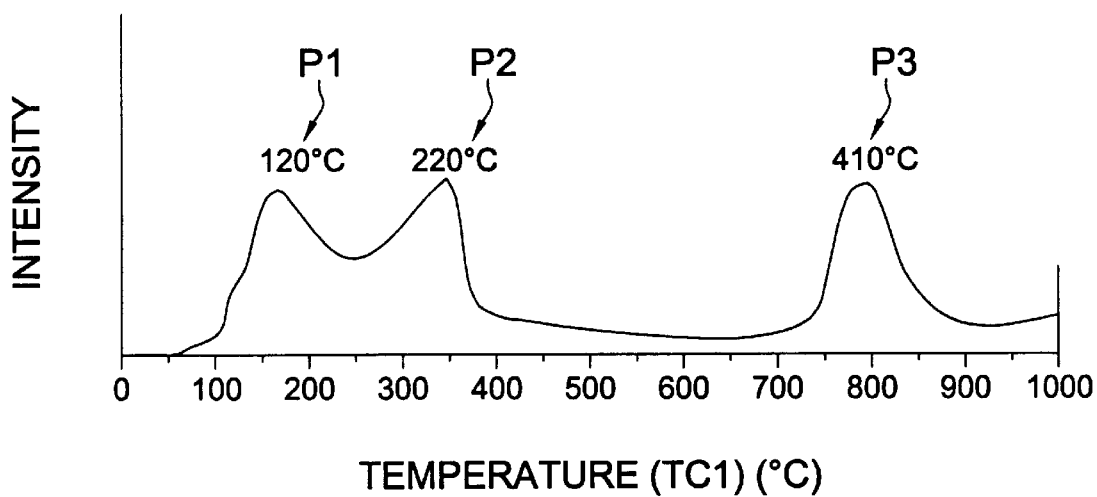
FIG. 12 shows the thermal desorption spectrum of the sample of the invention measured in Example 13.

The measurement result is shown in FIG. 12.

The horizontal axis represents the temperature of the controllable thermocouple TC1 positioned on the rear side and the vertical axis represents the intensity of the gas measurement at atomic weight 18 ($H_2O$), which corresponds to water vapor. There are peaks P1, P2 and P3 appearing in the chart. As the peak values, the temperatures measured by the thermocouple TC2 which measures the surface temperature of the sample are cited in the chart because there is a slight difference in the temperature values between thermocouples TC1 and TC2.

As a comparison example, a sample was prepared under the same heat treatment conditions except for the fact that the cooling step was also performed in the nitrogen atmosphere without containing water vapor. The thermal desorption spectrum was measured for the comparison sample. The result is shown in FIG. 13.

Figure 13:
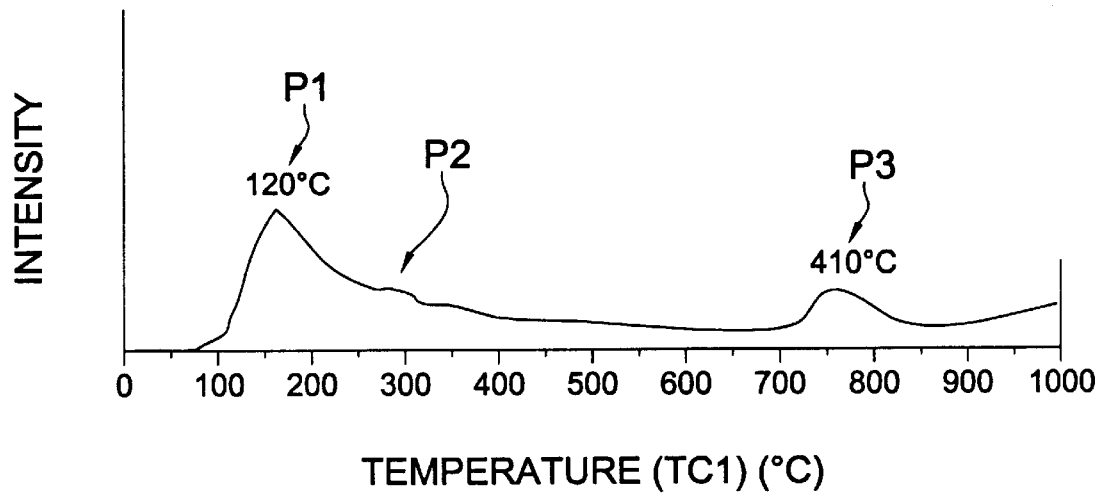
FIG. 13 shows the thermal desorption spectrum of the comparison example measured in Example 13.

As is clearly seen from FIGS. 12 and 13, when the cooling (temperature drop) in the heat treatment process was conducted in the air atmosphere which contains 1.2 mol % of water vapor, peaks P1 (surface temperature 120° C.), P2 (surface temperature 220° C.) and P3 (surface temperature 410° C.) were observed. On the other hand, when the cooling in the heat treatment process was performed in the nitrogen atmosphere without containing water vapor, only peaks P1 (120° C.) and P3 (410° C.) were observed, and peak P2 (220° C.) was not observed. Peak P1 in FIG. 13 results from the water attached to the surface of the sample by physical adsorption.

In order to identify the peak from among the three peaks, which is affected by the gas atmosphere during the cooling step performed after anodic oxidation, experimentation was performed. Nitrogen gas that passed through heavy water (D20) contained in the bubbler 430 shown in FIG. 5 was added during the cooling in the heat treatment process. Other than the gas atmosphere during the cooling, the experimentation was conducted under the same conditions as in example 13 for the sample having a characteristic shown in FIG. 12. Then, the obtained sample was measured by TDS to observe the spectrum with mass number 20 that corresponds to the peak of the heavy water. As a result, a peak was observed only in the same temperature range as P2.

From above, it can be seen that what causes the peak P2 (220° C.) is a substance introduced during the heat treatment in the atmosphere which contains water vapor. When measuring the anodic oxidation film formed in the examples 1 through 12 by TDS, peak P2 is clearly observed.

Thus, it is preferable to perform the heat treatment in the atmosphere containing water vapor under the temperature control to at least lower than 220° C.

(EXAMPLE 14)

Figure 15:
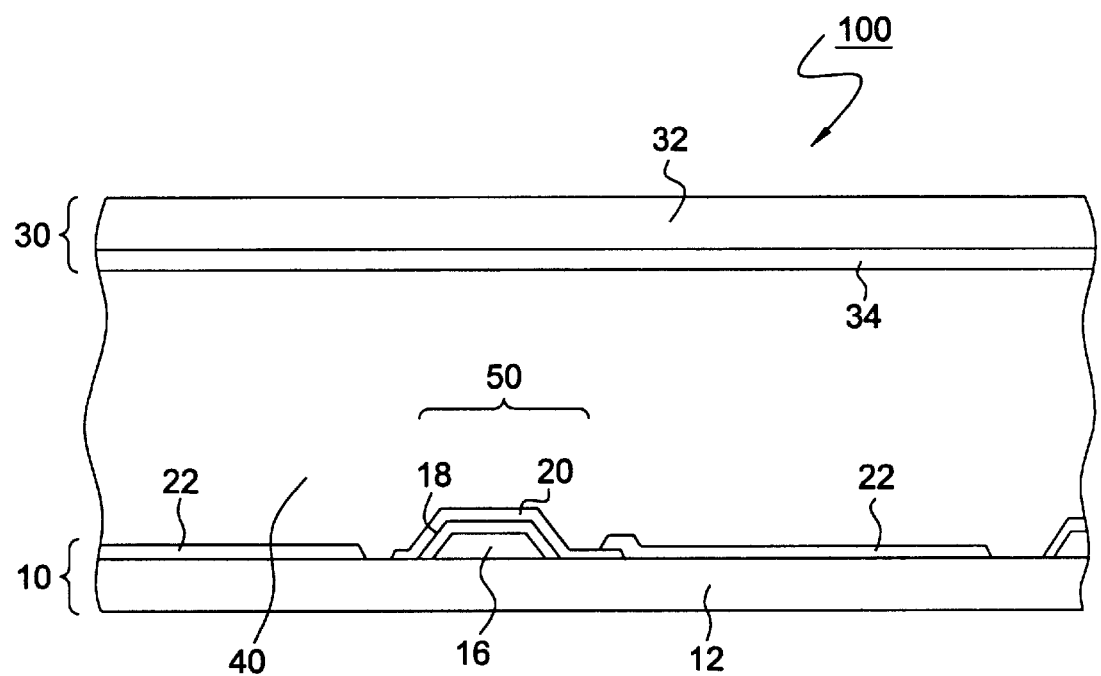
FIG. 15 is a cross-sectional view of the liquid crystal display device in which MIM nonlinear device is generally used.

After the MIM nonlinear device 50 was manufactured in the same manner as in Examples 6 and 9, ITO (Indium-Tin-Oxide) film with a thickness of 500 Å was formed by sputtering, which was then patterned to form a pixel electrode 22, as shown in FIG. 1. Thus, the electrode board 10 that comprises a transparent substrate 12, the MIM nonlinear device 50 formed on the transparent substrate 12 and pixel electrode 22 connected to the MIM nonlinear device 50 was completed. On the other hand, the ITO film was formed by sputtering on non-alkali glass transparent substrate 32. The ITO film was patterned to form an opposed signal electrode 32 and the other electrode substrate 30 was completed. Liquid crystal layer 40 was held between the electrode substrates 10 and 30 (FIG. 15).

Then, data line 78 composed of a Ta electrode layer 16 was connected to the data line driving circuit 76 while connecting scan line 74 composed of the opposite signal electrode 34 to scan line driving circuit 72 to make up a liquid crystal display device 100. According to the measurement of the display characteristic, the liquid crystal display device 100 showed high contrast and excellent image quality.

Another liquid crystal display device 100 was made using the MIM nonlinear device 50 formed in the same manner as in Examples 4, 7 and 9. After the measurement, the same high contrast and good image quality were obtained.

Figure 14:
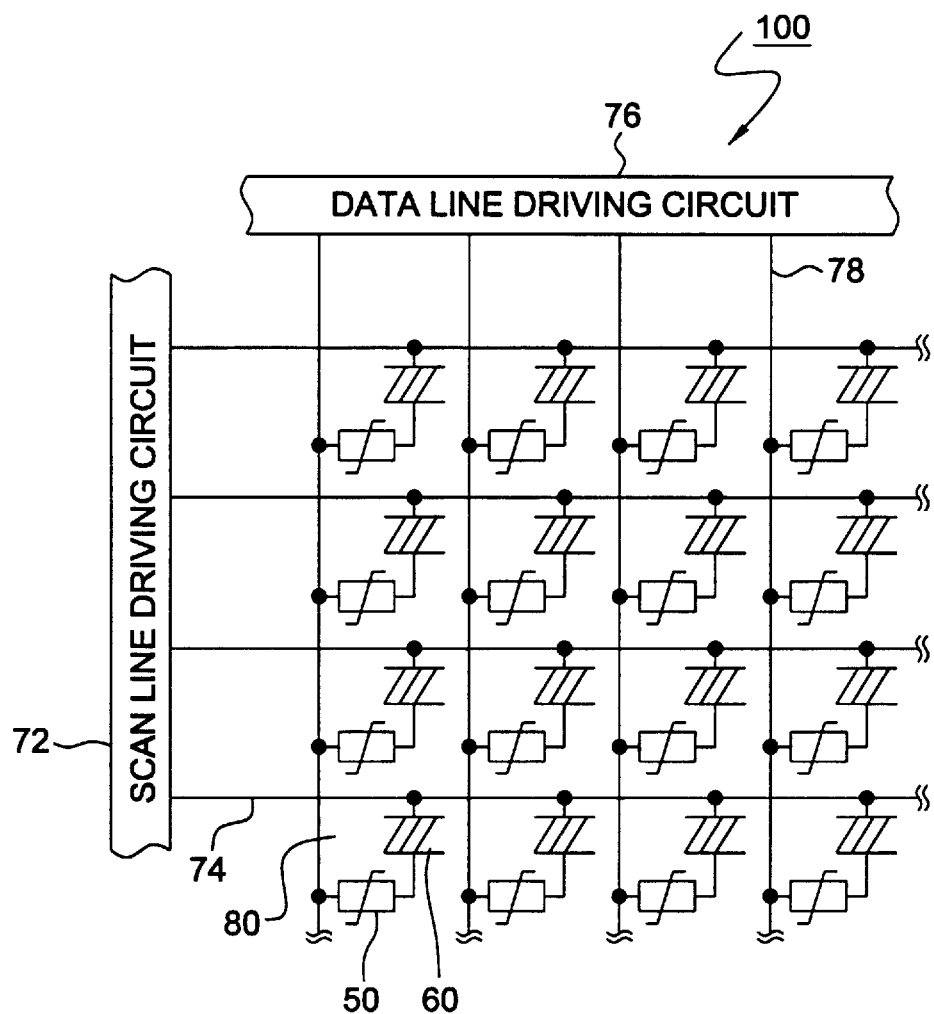
FIG. 14 shows the liquid crystal display device in which MIM nonlinear device is generally used.

Although the present invention has been described in conjunction with the preferred embodiments, the invention is not limited to those embodiments. In the embodiments the cooling step in the air or in the $N_2$ gas atmosphere containing water vapor was started at the same temperature as the heat treatment temperature in the $N_2$ gas atmosphere. However, the temperature may be lowered to a predetermined value in the same $N_2$ gas atmosphere after the heat treatment in the $N_2$ gas atmosphere, and after that the atmosphere may be changed to the air or to the $N_2$ gas which contains water vapor to further continue cooling. Moreover, Nb, W, Al or Mo may be added to the Ta electrode which contains Ta as the major component. Cr electrode layer 20 may be replaced by an electrode layer made of Ti, Mo, or Al. Furthermore, Cr electrode layer 20 may be omitted. If this is a case, pixel electrode 22 serves as Cr electrode layer 20. In FIG. 14, the connecting order of liquid crystal display element 60 and MIM nonlinear device 50 may be reversed between the scan line 74 and signal line 78.

Industrial Applicability

The manufacturing method of the MIM nonlinear device in accordance with the invention is suitably applied to manufacture of MIM nonlinear devices used in the liquid crystal display apparatus which requires superior image quality.

What is claimed is:

1. A method for manufacturing a two-terminal nonlinear device comprising a first conductive layer, an oxidation film and a second conductive layer, the method comprising the steps of:

forming the first conductive layer on a substrate;

forming the oxidation film on the first conductive layer;

performing heat treatment to the substrate, on which the first conductive layer and the oxidation film have been formed, in a gas atmosphere that contains water vapor; and forming the second conductive layer on the oxidation film after the heat treatment step.

2. The method according to claim 1, wherein the first conductive layer is made of tantalum (Ta).

3. The method according to claim 2, wherein the oxidation film is an anodic oxidation film of the first conductive layer.

4. The method according to claim 1, wherein the first conductive layer contains Ta as a major component, and at least one element selected from the group consisting of tungsten (W), rhenium (Re) and molybdenum (Mo) is added to the first conductive layer.

5. The method according to claim 4, wherein the oxidation film is an anodic oxidation film of the first conductive layer.

6. The method according to claim 1, wherein the oxidation film is an anodic oxidation film of the first conductive layer.

7. The method according to claim 1, wherein the second conductive layer is made of one of chromium (Cr), titanium (Ti), aluminum (Al) and molybdenum (Mo).

8. The method according to claim 7, wherein the second conductive layer is made of Cr.

9. The method according to claim 1, wherein the gas atmosphere that contains water vapor is air.

10. The method according to claim 1, wherein the gas atmosphere that contains water vapor is a mixture gas of water vapor and inert gas.

11. The method according to claim 10, wherein the inert gas is nitrogen gas.

12. The method according to claim 1, wherein the gas atmosphere that contains water vapor is a mixture gas of air and nitrogen gas.

13. The method according to claim 1, wherein a water vapor concentration in the gas atmosphere that contains the water vapor is equal to or is more than 0.001 mol % with respect to the entire gas that contains the water vapor.

14. The method according to claim 1, wherein a water vapor concentration in the gas atmosphere that contains the water vapor is equal to or is more than 0.005 mol % with respect to the entire gas that contains the water vapor.

15. The method according to claim 1, wherein a water vapor concentration in the gas atmosphere that contains the water vapor is equal to or is more than 0.014 mol % with respect to the entire gas that contains the water vapor.

16. The method according to claim 1, wherein the heat treatment step performed to the substrate having the first conductive layer and the oxidation film formed thereon is a final temperature drop step in the entire heat treatment process to the substrate having the first conductive layer and the oxidation film formed thereon.

17. The method according to claim 16, wherein the final temperature drop step includes at least a temperature drop to 220° C.

18. The method according to claim 16, wherein a temperature drop rate in the final temperature drop step is in a range of from 0.1° C./min to 60° C./min.

19. The method according to claim 18, wherein the gas atmosphere includes nitrogen gas.

20. The method according to claim 16, wherein the final temperature drop step is a step of lowering a temperature from a first temperature to a second temperature, the method further comprising the step of performing the heat treatment step to the substrate on which the first conductive layer and the oxidation film have been formed at a temperature above the first temperature.

21. The method according to claim 16, wherein the final temperature drop step is a step of lowering a temperature from a first temperature to a second temperature, the method further comprising the step of performing the heat treatment step to the substrate on which the first conductive layer and the oxidation film have been formed in an inert gas atmosphere at a temperature above the first temperature.

22. A two-terminal nonlinear device manufactured by the method of claim 1, which is obtained by forming the second conductive layer on the oxidation film, the oxidation film having a peak observed through measurement of thermal desorption spectrum, the device having a heat treated substrate with the first conductive layer and the oxidation film formed thereon, the heat treated substrate heated in a gas atmosphere that contains water vapor.

23. A liquid crystal device comprising a pair of substrates, a two-terminal nonlinear device on one substrate manufactured by the method of claim 1 as a switching device of a pixel, a liquid crystal layer formed between said pair of substrates, said one substrate having the first conductive layer and the oxidation layer formed thereon being heat-treated.

24. A two-terminal nonlinear device comprising a first conductive layer, an oxidation film and a second conductive layer, wherein the oxidation film has a peak observed through measurement of thermal desorption spectrum, the device having a heat treated substrate with the first conductive layer and the oxidation film formed thereon, the heat treated substrate heated in a gas atmosphere that contains water vapor.

* * * * *